United States Patent
Jang

(10) Patent No.: US 12,211,565 B2
(45) Date of Patent: Jan. 28, 2025

(54) STORAGE DEVICE AND READ RECOVERY METHOD THEREOF

(71) Applicant: SK hynix Inc., Gyeonggi-do (KR)

(72) Inventor: In Jong Jang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 18/363,734

(22) Filed: Aug. 2, 2023

(65) Prior Publication Data

US 2024/0290403 A1  Aug. 29, 2024

(30) Foreign Application Priority Data

Feb. 27, 2023  (KR) .................. 10-2023-0025741

(51) Int. Cl.
*G11C 16/34* (2006.01)
*G06F 11/14* (2006.01)
*G11C 16/08* (2006.01)
*G11C 16/26* (2006.01)

(52) U.S. Cl.
CPC ........ *G11C 16/3459* (2013.01); *G06F 11/141* (2013.01); *G11C 16/08* (2013.01); *G11C 16/26* (2013.01)

(58) Field of Classification Search
CPC ..... G11C 16/3459; G11C 16/08; G11C 16/26; G06F 11/141
See application file for complete search history.

(56) References Cited

U.S. PATENT DOCUMENTS

2019/0155546 A1* 5/2019 Cai .................. G06F 3/0659
2021/0306003 A1* 9/2021 Kim .................. H03M 13/1134
2024/0045762 A1* 2/2024 Gohain ............. G06F 3/0659

* cited by examiner

*Primary Examiner* — Cynthia Britt
(74) *Attorney, Agent, or Firm* — IP & T GROUP LLP

(57) ABSTRACT

Provided is an operation method of a memory controller which includes obtaining first read data from a second external device based on a first read command received from a first external device and performing error correction and decoding on the first read data to determine whether reading is successful or unsuccessful, performing a hard decoding-based read recovery operation and a soft decoding-based read recovery operation when a read failure occurs as a result of the first read operation, determining whether there is a second read command queued when the hard decoding-based read recovery has failed, temporarily stopping the read recovery operation for the first read data when there is the second read command queued and obtaining second read data by reading data from the second external device based on the second read command and performing error correction and decoding on the second read data.

15 Claims, 7 Drawing Sheets

FIG. 7

| Block | WL | Page | Die0 | | | Die1 | | | Die2 | | | Die3 | | |
|---|---|---|---|---|---|---|---|---|---|---|---|---|---|---|
| | | | P0 | P1 | P2 P3 | P0 | P1 | P2 P3 | P0 | P1 | P2 P3 | P0 | P1 | P2 P3 |
| 0 | 0 | 0(LSB) | | | | | | | | | | | | |
| | | 1(CSB) | RR(S720) | | | | | | | | | | | |
| | | 2(MSB) | | | | | | | | | | | | |
| | 1 | 0(LSB) | | | | | | | | | | | | |
| | | 1(CSB) | | | | RF(S710) | | | | | | | | |
| | | 2(MSB) | | | | | | | | | | | | |
| | 2 | 0(LSB) | | | | | | | | | | | | |
| | | 1(CSB) | RR(S730) | | | RR(S740) | | | | | | | | |
| | | 2(MSB) | | | | | | | | | | | | |
| 1 | n | 0(LSB) | | | | | | | | | | | | |
| | | 1(CSB) | | | | | | | | | | | | |
| | | 2(MSB) | | | | | | | | | | | | |

STORAGE DEVICE AND READ RECOVERY METHOD THEREOF

CROSS REFERENCE TO RELATED APPLICATION

The present application claims the benefit under 35 USC § 119(a) of Korean Patent Application No. 10-2023-0025741, filed Feb. 27, 2023, the entire contents of which is incorporated herein for all purposes by this reference.

TECHNICAL FIELD

Various embodiments of the present disclosure relate to an operation method of a storage device, and more particularly, to a read recovery method of a storage device.

BACKGROUND

A storage device is capable of storing data at a command from an external device such as a computer, a mobile terminal such as a smart phone or tablet, or various electronic devices.

The storage device may include a memory and a memory controller for controlling the memory. The memory controller may receive a command from the external device. According to the received command, the memory controller may perform or control operations for reading data from the memory, writing data to the memory/performing programming of data, or erasing data in the memory.

When reading fails during a read operation, the storage device may recover the failed reading according to a hard decoding and/or soft decoding method.

Hard decoding has a low recovery cost and a fast recovery speed but a low recovery probability. Soft decoding has a high recovery cost and a slow recovery speed but a high recovery probability. In order to efficiently perform read recovery using the advantages of hard decoding and soft decoding, a read recovery algorithm may be implemented to first perform hard decoding and perform soft decoding when hard decoding fails.

However, when the recovery algorithm is implemented as described above, the recovery algorithm may take a considerable amount of time until the recovery is completed, thus causing a considerable latency in not only the current reading operation but also read operations queued and deterioration in system performance.

SUMMARY

Various embodiments of the present disclosure have been made to address the above-mentioned issues occurring in the prior art and provide a new recovery algorithm to reduce a recovery time for failed reading.

In addition, various embodiments of the present disclosure provide a new recovery algorithm capable of reducing a latency which may be experienced by a read operation queued in the back due to failed reading.

The technical tasks to be achieved in the present disclosure are not limited to the technical tasks mentioned above, and other technical tasks not mentioned can be clearly understood by those of ordinary skill in the art to which the present disclosure belongs from the description below.

According to embodiments of the present disclosure, an operation method of a memory controller includes a first read operation of obtaining first read data from a second external device based on a first read command received from a first external device and performing error correction and decoding on the first read data to determine whether the first read operation is successful or unsuccessful, a first read recovery operation of performing a hard decoding-based read recovery operation and a soft decoding-based read recovery operation when the first read operation is determined to be unsuccessful, an operation of determining whether there is a second read command queued when the hard decoding-based read recovery operation has failed, and an operation of temporarily stopping the first read recovery operation when there is the second read command queued; and a second read operation of obtaining second read data from the second external device based on the second read command and performing the error correction and decoding on the second read data.

According to embodiments of the present disclosure, the operation method may further include performing the soft decoding-based read recovery operation after the second read operation is successful.

According to embodiments of the present disclosure, the operation method may further include performing, after the second read operation is successful and when there are read commands queue, a third read operation according to each of third read commands queued until the third read commands queued have been processed, and performing the soft decoding-based read recovery operation by resuming the first read recovery operation after the read operation according to each of the read commands queued have been processed.

According to embodiments of the present disclosure, the operation method may further include an operation of resuming, in a case where an abort command for the first read command is received while the first read recovery operation is temporarily stopped, the first read recovery operation when the memory controller is in an idle state.

According to embodiments of the present disclosure, the hard decoding-based read recovery operation may include at least one of a history read operation, a hard read retry operation, and an eBoost operation.

According to embodiments of the present disclosure, the hard decoding-based read recovery operation may include an adjacent word line-based read operation of providing, to the second external device as information of a read voltage for the first read operation, information of a second read voltage which has applied to a second word line adjacent to a first word line of a page to be read in the first read operation, and obtaining the first read data from the second external device.

According to embodiments of the present disclosure, the hard decoding-based read recovery operation may include an adjacent page-based read operation of providing, to the second external device, as information of a read voltage for the first read operation, information of a third read voltage which has been used in reading a page adjacent to a page to be read in the first read operation and obtaining the first read data from the second external device.

According to embodiments of the present disclosure, a memory controller includes a controller configured to perform a first read operation of obtaining first read data from a second external device based on a first read command received from a first external device, and performing error correction and decoding on the first read data to determine whether the first read operation is successful or unsuccessful, perform a hard decoding-based read recovery operation for recovering the first read data when the first read operation is determined to be unsuccessful, determine whether there is a second read command queued when the hard decoding-based read recovery operation fails, and perform a second read operation of obtaining, when there is the second read command queued second read data from the second external device based on the second read command and performing error correction and decoding on the second read data without performing a soft decoding-based read recovery operation for recovering the first read data.

According to embodiments of the present disclosure, a storage device includes a memory configured to receive information of a read voltage, determine values of data recorded in memory cells based on the read voltage and provide the data, and a memory controller configured to perform a first read operation of obtaining first read data from the memory based on a first read command received from an external device, and performing error correction and decoding on the first read data to determine whether the first read operation is successful or unsuccessful, perform a hard decoding-based read recovery operation for recovering the first read data when the first read operation is determined to be unsuccessful, determine whether there is a second read command queued when the hard decoding-based read recovery fails, and perform a second read operation of obtaining, when there is the second read command queued, second read data from the memory based on the second read command and performing the error correction and decoding on the second read data without performing a soft decoding-based read recovery operation for recovering the first read data.

BRIEF DESCRIPTION OF THE DRAWINGS

FIG. 7 is a diagram illustrating a read recovery operation using read voltages for adjacent pages according to an embodiment of the present disclosure.

DETAILED DESCRIPTION

Hereinafter, embodiments of the present disclosure will be described in detail with reference to the accompanying drawings.

Figure 1:
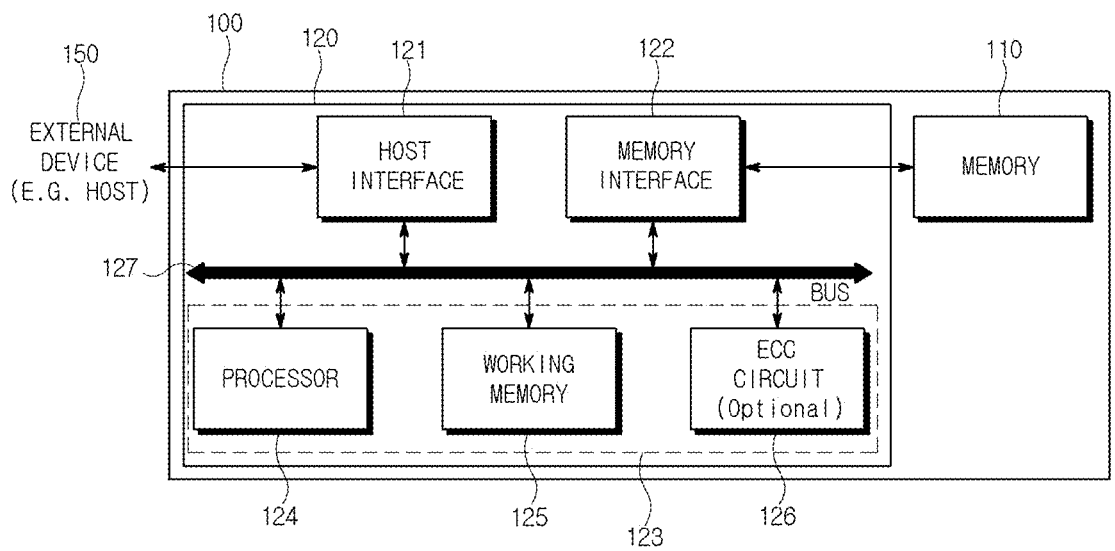
FIG. 1 is a diagram schematically illustrating a configuration of a storage device according to embodiments of the present disclosure.

FIG. 1 is a diagram schematically illustrating a configuration of a storage device 100 according to embodiments of the present disclosure.

Referring to FIG. 1, a storage device 100 according to embodiments of the present disclosure may include a memory 110 that stores data and a controller 120 that controls the memory 110. When needed, additional components may be further included in the storage device 100.

The memory 110 may operate in response to control of the controller 120. Here, the operation of the memory 110 may include, for example, a read operation, a program operation (also referred to as "write operation"), and an erase operation.

For example, the memory 110 may include various types of non-volatile memories, such as NAND flash memory, 3D NAND flash memory, NOR flash memory, resistive random access memory (RRAM), Phase-Change Memory (PRAM), Magnetoresistive Random Access Memory (MRAM), Ferroelectric Random Access Memory (FRAM), or Spin Transfer Torque Random Access Memory (STT-RAM) and the like.

The memory 110 may be implemented as a three-dimensional array structure. The embodiments of the present disclosure may be applied not only to a flash memory in which a charge storage layer is made of a conductive floating gate, but also to a charge trap flash (CTF) in which a charge storage layer is made of an insulating film.

The memory 110 may receive a command, an address or the like from the controller 120 (also referred to as a memory controller), and access a region of a memory cell array selected by the address. That is, the memory 110 may perform an operation instructed by a command on the region selected by the address.

For example, the memory 110 may perform a program operation, a read operation, an erase operation or the like. During a program operation, the memory 110 may program data in the region selected by the address. During a read operation, the memory 110 may read data from the region selected by the address. During an erase operation, the memory 110 may erase data stored in the region selected by the address.

The controller 120 may control program (write), read, erase, and background operations with respect to the memory 110. Here, the background operation may include one or more of Garbage Collection (GC), Wear Leveling (WL), Read Reclaim (RR), or Bad Block Management (BBM) operations.

The controller 120 may control the operation of the memory 110 according to a command from an external device (e.g., a host) located outside the storage device 100. On the other hand, the controller 120 may control an operation of the memory 110 regardless of a command from an external device.

The external device may include a computer, an Ultra Mobile PC (UMPC), a workstation, a Personal Digital Assistant (PDA), a tablet PC, a mobile phone, a smart phone, an e-book, a portable multimedia player (PMP), a portable game machine, a navigation device, a black box, a digital camera, a Digital Multimedia Broadcasting (DMB) player, a smart television, a digital audio recorder, a digital audio player, a digital picture recorder, a digital picture player, a digital video recorder, a digital video player, a storage constituting a data center, one of various electronic devices constituting a home network, one of various electronic devices constituting a computer network, one of various electronic devices constituting a telematics network, a radio frequency identification (RFID) device, a mobility device (e.g., vehicle, robot, drone) that travels on the ground, water, or air under human control or autonomously travels, and the like.

The external device may include at least one operating system (OS). The operating system may generally manage and control functions and operations of the external device, and provide mutual operation between the external device and the storage device 100. The operating system may be classified into a general operating system and a mobile operating system according to the mobility of an external device.

The controller 120 and an external device may be separate devices. In some cases, the controller 120 and the external device may be implemented as an integrated device. Hereinafter, for convenience of description, a description will be given by taking, as an example, a case in which the controller 120 and an external device are separate devices will be described.

Referring to FIG. 1, the controller 120 may include a host interface 121, a memory interface 122, a control circuit 123, and the like.

The host interface 121 may provide an interface for communication with an external device. For example, the host interface 121 may include an interface using at least one of various communication standards or interfaces such as a universal serial bus (USB) protocol, a multimedia card (MMC) protocol, a peripheral component interconnection (PCI) protocol, a PCI-express (PCI-e or PCIe) protocol, an advanced technology attachment (ATA) protocol, a serial-ATA protocol, a parallel-ATA protocol, an SCSI (small computer small interface) protocol, an enhanced small disk interface (ESDI) protocol, an integrated drive electronics (IDE) protocol, a system management bus (SMBus) protocol, an inter-integrated circuit (I2C) protocol, an improved inter-integrated circuit (I3C) protocol, a proprietary protocol, and the like.

The control circuit 123 may receive a command through the host interface 121 and perform an operation for processing the received command.

The memory interface 122 may be connected to the memory 110 to provide an interface for communication with the memory 110. That is, the memory interface 122 may provide an interface between the memory 110 and the controller 120 in response to control by the control circuit 123.

The control circuit 123 may control the operation of the memory 110 by performing overall control operations of the controller 120. To this end, according to an embodiment, the control circuit 123 may include a processor 124 and a working memory 125, and may further include an error detection and correction circuit (ECC Circuit) 126 optionally.

The processor 124 may control overall operation of the controller 120.

The processor 124 may communicate with an external device through the host interface 121 and communicate with the memory 110 through the memory interface 122.

The processor 124 may perform a function of a flash translation layer (FTL). The processor 124 may translate a logical block address provided by an external device into a physical block address through a flash translation layer (FTL). The flash translation layer may receive a logical block address and translate the logical block address into a physical block address using a mapping table.

There are several methods for address mapping of the flash translation layer according to mapping units. Representative address mapping methods may include a page mapping method, a block mapping method, and a hybrid mapping method.

The processor 124 may randomize data received from an external device. For example, the processor 124 may randomize data received from an external device using a set randomizing seed. The randomized data may be provided to the memory 110 and programmed in the memory 110.

The processor 124 may de-randomize data received from the memory 110 during a read operation. For example, the processor 124 may derandomize data received from the memory 110 using a de-randomizing seed. The de-randomized data may be output to the external device.

The processor 124 may perform background functions for the memory 110 such as a garbage collection (GC) function, a wear leveling (WL) function, and a bad block management function.

The garbage collection function may refer to a function of collecting pieces of data partially recorded in memory blocks, and moving and recording the data to and in another memory block in order to secure free space to record data when there is not enough space to record data in the memory 110.

The wear leveling function may be a function for evenly writing data to all memory blocks of the memory 110 to prevent excessive use of a specific block in order to prevent errors and data loss of the memory 110 in advance and improve durability and stability of a product.

The bad block management function may be a function of detecting a bad block in the memory 110 and, when there is a reserved block, preventing data from being written to the bad block by replacing the bad block with the reserved block.

The processor 124 may control the operation of the controller 120 by executing firmware. The processor 124 may control overall operations of the controller 120 and execute (drive) firmware stored in the working memory 125 during booting. Hereinafter, the operation of the storage device 100 to be described in the embodiments of the present disclosure may be implemented in a manner in which the processor 124 executes firmware in which a corresponding operation is defined.

The firmware is a program executed in the storage device 100 to drive the storage device 100 and may include various functional layers. For example, the firmware may include binary data in which codes for executing each of the aforementioned functional layers are defined.

For example, the firmware may include a flash translation layer that performs a translation function between a logical block address for transmission from an external device to the storage device 100 and a physical block address of the memory 110, a host interface layer (HIL) that interprets a command received from an external device through the host interface 121 and transfers the command to a flash translation layer, and a flash Interface layer (FIL) that transfers a command instructed by the flash translation layer to the memory 110.

Also, the firmware may include a garbage collection function, a wear leveling function, and a bad block management function.

The firmware may be loaded into the working memory 125 from, for example, the memory 110 or a separate non-volatile memory (e.g., ROM or NOR Flash) located outside the memory 110. When executing a booting operation after power-on, the processor 124 may first load all or part of the firmware into the working memory 125.

The processor 124 may perform logic operations defined in firmware loaded into the working memory 125 to control the overall operation of the controller 120. The processor 124 may store a result of performing the logic operation defined in the firmware in the working memory 125. The processor 124 may allow the controller 120 to generate a command or a signal according to the result of performing the logic operation defined in the firmware. When the part of the firmware in which the logical operation to be performed is defined is not loaded into the working memory 125, the processor 124 may generate an event (e.g., interrupt) for loading the corresponding part of the firmware into the working memory 125.

The processor 124 may load meta data required to drive the firmware from the memory 110. The meta data is data for managing the memory 110 and may include management information about user data stored in the memory 110.

The firmware may be updated while the storage device 100 is being produced or the storage device 100 is running. The controller 120 may download new firmware from the outside of the storage device 100 and update existing firmware to new firmware.

The working memory 125 may store firmware, program codes, commands, or data required to drive the controller 120. The working memory 125 is, for example, a volatile memory, and may include one or more of static RAM (SRAM), dynamic RAM (DRAM), and synchronous DRAM (SDRAM).

An error detection and correction circuit 126 may detect an error bit of target data using an error correction code and correct the detected error bit. Here, the target data may be, for example, data stored in the working memory 125 or data read from the memory 110.

The error detection and correction circuitry 126 may be implemented to decode data with an error correction code. The error detection and correction circuitry 126 may be implemented with a variety of decoders. According to one embodiment, the error detection and correction circuit 126 may be implemented as a low density parity check (LDPC) decoder.

For example, the error detection and correction circuitry 126 may detect an error bit in units of sectors set for each read data. That is, each read data may be composed of a plurality of sectors. A sector may refer to a data unit smaller than a page, which is a read unit of a flash memory. Sectors constituting each read data may be associated with each other through addresses.

The error detection and correction circuit 126 may calculate a bit error rate (BER) and determine whether correction is possible in units of sectors. For example, when the bit error rate (BER) is higher than a set reference value, the error detection and correction circuit 126 may determine that a corresponding sector is uncorrectable or fail. On the other hand, when the bit error rate (BER) is lower than the reference value, the error detection and correction circuit 126 may determine that a corresponding sector is correctable or pass.

The error detection and correction circuit 126 may perform error detection and correction operation on all pieces of read data, sequentially. When a sector included in read data is correctable, the error detection and correction circuit 126 may omit an error detection and correction operation for a corresponding sector of next read data. When the error detection and correction operation has been performed on for all pieces of read data, the error detection and correction circuit 126 may detect sectors finally determined to be uncorrectable. The number of sectors determined to be uncorrectable may be one or more. The error detection and correction circuit 126 may transmit information (e.g., address information) on a sector determined to be uncorrectable to the processor 124.

The error detection and correction circuit 126 may perform encoding on original data to be obtained from the external device 150 and stored in the memory 110 for error detection and correction to generate encoding data including parity data for error correction. The generated encoding data may be stored in the memory 110 under the control of the memory interface 122.

A bus 127 may provide channels between the components 121, 122, 124, 125, and 126 of the controller 120. The bus 127 may include, for example, a control bus for transferring various control signals, commands, and the like and a data bus for transferring a variety of data.

On the other hand, some of the aforementioned components 121, 122, 124, 125, and 126 of the controller 120 may be deleted, or the aforementioned components 121, 122, 124, 125, and 126 of the controller 120 may be integrated into one component. In some cases, one or more other components may be added in addition to the above-described components of the controller 120.

Figure 2:
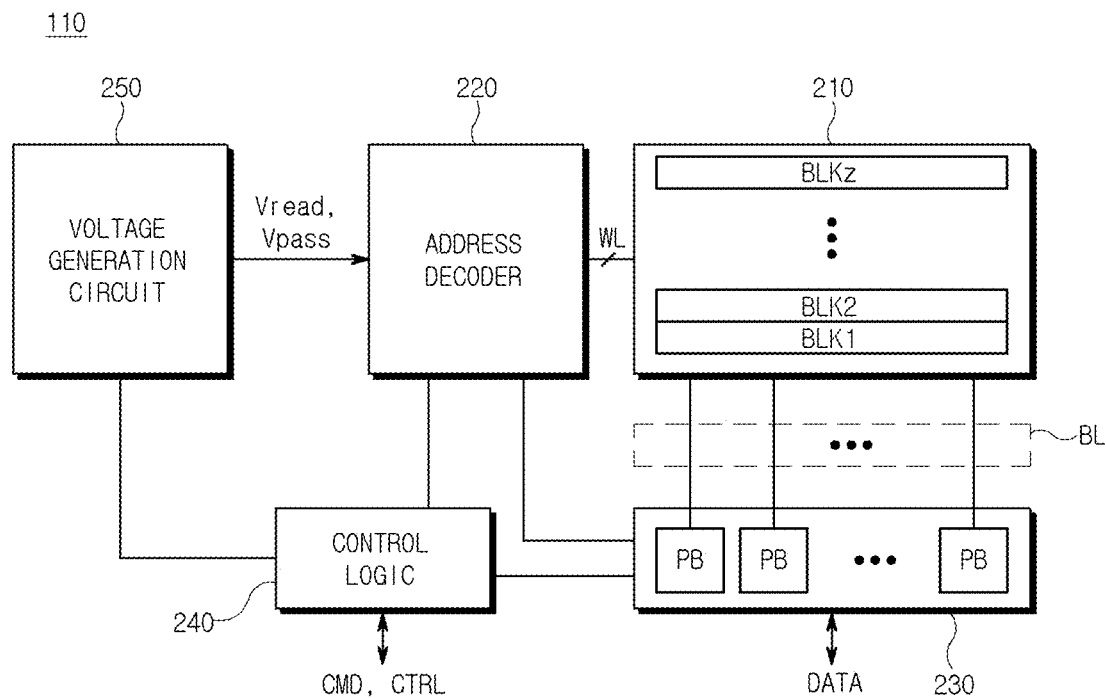
FIG. 2 is a block diagram schematically illustrating a memory according to embodiments of the present disclosure.

FIG. 2 is a block diagram schematically illustrating a memory 110 according to embodiments of the present disclosure.

Referring to FIG. 2, a memory 110 according to embodiments of the present disclosure may include a memory cell array 210, an address decoder 220, a read and program circuit (or a read and write circuit) 230, a control logic 240, a voltage generation circuit 250, and the like.

The memory cell array 210 may include a plurality of memory blocks BLK1 to BLKz (where z is a natural number greater than or equal to 2).

In the plurality of memory blocks BLK1 to BLKz, a plurality of word lines WL and a plurality of bit lines BL may be disposed and a plurality of memory cells MC may be arranged.

The plurality of memory blocks BLK1 to BLKz may be connected to the address decoder 220 through the plurality of word lines WL. The plurality of memory blocks BLK1 to BLKz may be connected to the read and program circuit 230 through the plurality of bit lines BL.

Each of the plurality of memory blocks BLK1 to BLKz may include a plurality of memory cells. For example, the plurality of memory cells are non-volatile memory cells and may be configured as non-volatile memory cells each having a vertical channel structure.

The memory cell array 210 may be configured as a two-dimensional memory cell array. In some cases, the memory cell array 210 may be configured as a three-dimensional memory cell array.

Each of a plurality of memory cells included in the memory cell array 210 may store at least one bit of data. For example, each of a plurality of memory cells included in the memory cell array 210 may be a single-level cell (SLC) that stores one bit of data. As another example, each of the plurality of memory cells included in the memory cell array 210 may be a multi-level cell (MLC) that stores two bits of data, a triple-level cell (TLC) that stores three bits of data, or a quad-level cell (QLC) that stores four bits of data. As another example, the memory cell array 210 may include a plurality of memory cells each storing five or more bits of data.

Referring to FIG. 2, the address decoder 220, the read and program circuit 230, the control logic 240, the voltage generation circuit 250 and the like may operate as peripheral circuits for driving the memory cell array 210.

The address decoder 220 may be connected to the memory cell array 210 through a plurality of word lines WL.

The address decoder 220 may operate in response to control by the control logic 240.

The address decoder 220 may receive an address through an input/output buffer in the memory 110. The address decoder 220 may decode a block address among received addresses. The address decoder 220 may select at least one memory block according to the decoded block address.

The address decoder 220 may receive a read voltage Vread and a pass voltage Vpass from the voltage generation circuit 250.

During a read operation, the address decoder 220 may apply the read voltage Vread to a selected word line WL in the selected memory block and apply the pass voltage Vpass to the remaining non-selected word lines WL.

During a program verify operation, the address decoder 220 may apply a verify voltage generated by the voltage generation circuit 250 to the selected word line WL in the selected memory block, and apply the pass voltage Vpass to the remaining non-selected word lines WL.

The address decoder 220 may decode a column address among received addresses. The address decoder 220 may transmit the decoded column address to the read and program circuit 230.

A read operation and program operation of the memory 110 may be performed in units of pages. An address received at a command for a read operation and a program operation may include one or more of a block address, a row address, and a column address.

The address decoder 220 may select one memory block and one word line according to the block address and the row address. The column address may be decoded by the address decoder 220 and provided to the read and program circuit 230.

The address decoder 220 may include one or more of a block decoder, a row decoder, a column decoder, an address buffer and the like.

The read and program circuit 230 may include a plurality of page buffers PB. The read and program circuit 230 may operate as a "read circuit" during the read operation of the memory cell array 210 and operate as a "program circuit" during a program operation."

The aforementioned read and program circuit 230 may include a page buffer circuit including a plurality of page buffers PB, which is also referred to as a data register circuit.

The plurality of page buffers PB may be connected to the memory cell array 210 through a plurality of bit lines BL. The plurality of page buffers PB may detect a change in the amount of current flowing according to the program state of a corresponding memory cell through a sensing node and perform latching as sensing data while continuously supplying a sensing current to the bit lines BL connected to the memory cells in order to sense the threshold voltages Vth of the memory cells during a read operation or a program verify operation.

The read and program circuit 230 may operate in response to page buffer control signals output from the control logic 240.

The read and program circuit 230 may sense data of a memory cell during a read operation, temporarily store the read data, and then output data DATA to the input/output buffer of the memory 110. In an embodiment, the read and program circuit 230 may include a column selection circuit and the like in addition to page buffers PB or page registers.

The control logic 240 may be connected to the address decoder 220, the read and program circuit 230, the voltage generation circuit 250 and the like. The control logic 240 may receive a command CMD and a control signal CTRL through the input/output buffer of the memory 110 from the controller 120.

The control logic 240 may control overall operations of the memory 110 in response to the control signal CTRL. The control logic 240 may output a control signal for adjusting the pre-charge potential levels of the sensing nodes of the plurality of page buffers PB.

The control logic 240 may control the read and program circuit 230 to perform a read operation of the memory cell array 210. The voltage generation circuit 250 may generate a read voltage Vread and a pass voltage Vpass used during a read operation, in response to a voltage generation circuit control signal output from the control logic 240.

Figure 3:
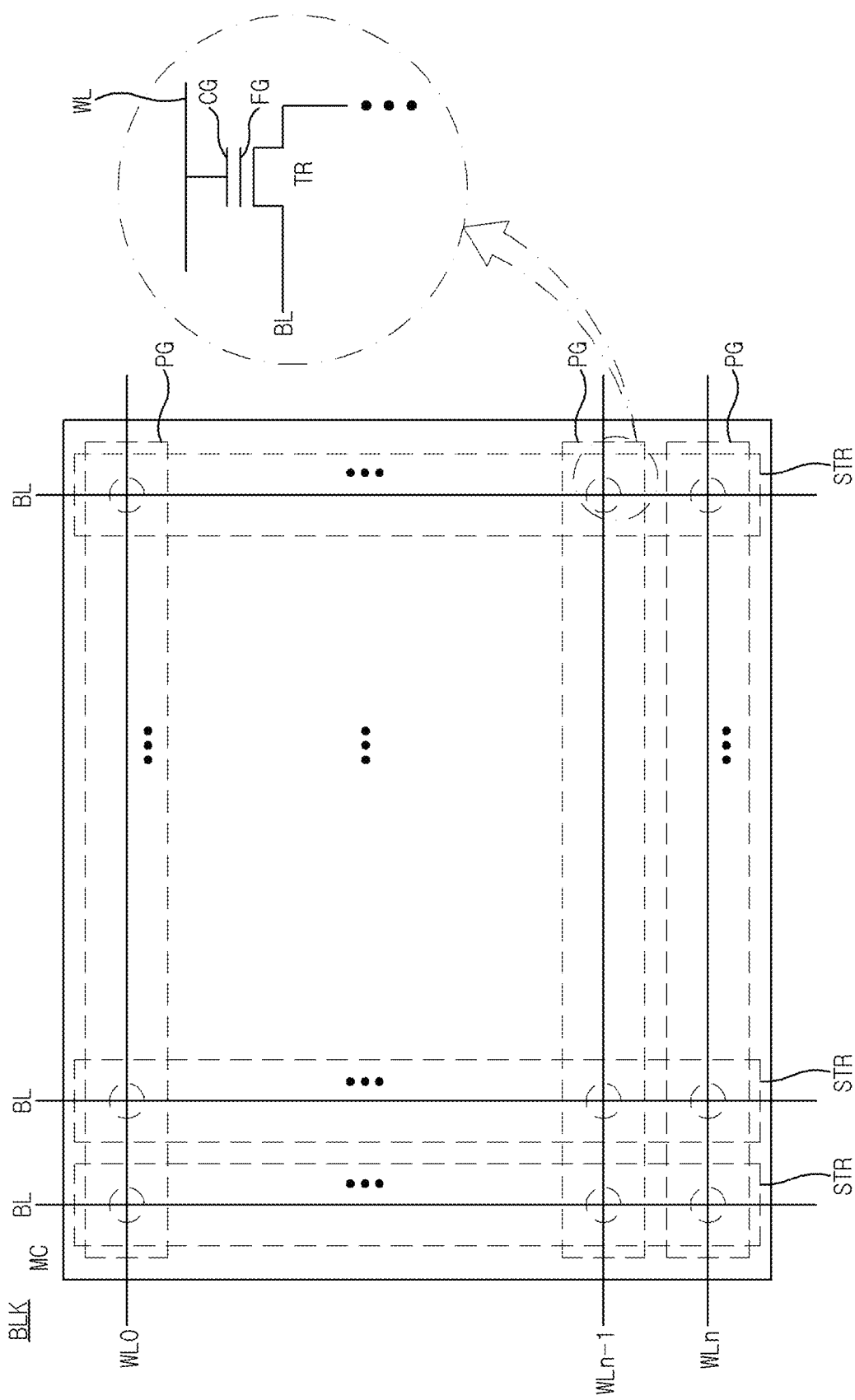
FIG. 3 is a diagram schematically illustrating each memory block of a memory according to embodiments of the present disclosure.

FIG. 3 is a diagram schematically illustrating each memory block BLK of the memory 110 according to embodiments of the present disclosure.

Referring to FIG. 3, a memory block BLK included in the memory 110 may be arranged, for example, at positions where a plurality of pages PG and a plurality of strings STR cross each other.

The plurality of pages PG corresponds to a plurality of word lines WL, and the plurality of strings STR corresponds to a plurality of bit lines BL.

A plurality of word lines WL and a plurality of bit lines BL may be disposed in the memory block BLK while crossing each other. For example, each of the plurality of word lines WL may be disposed in a row direction, and each of the plurality of bit lines BL may be disposed in a column direction. For another example, each of the plurality of word lines WL may be disposed in a column direction, and each of the plurality of bit lines BL may be disposed in a row direction.

A plurality of memory cells MC may be defined at positions where the plurality of word lines WL and the plurality of bit lines BL cross each other. A transistor TR may be disposed in each memory cell MC.

For example, the transistor TR disposed in each memory cell MC may include a drain, a source, and a gate. The drain (or source) of the transistor TR may be connected to a corresponding bit line BL directly or via another transistor TR. The source (or drain) of the transistor TR may be connected to a source line (which may be ground) directly or via another transistor TR. The gate of the transistor TR may include a floating gate (FG) surrounded by an insulator and a control gate (CG) to which a gate voltage is applied from a word line (WL).

In each of the plurality of memory blocks BLK1 to BLKz, a first selection line (also referred to as a source selection line or a drain selection line) may be further disposed outside a first outermost word line, which is more adjacent to the read and program circuit 230, among the two outermost word lines and a second selection line (also referred to as a drain selection line or a source selection line) may be further disposed outside the second outermost word line among the two outermost word lines.

In some cases, one or more dummy word lines may be further disposed between the first outermost word line and the first selection line. In addition, one or more dummy word lines may be further disposed between the second outermost word line and the second selection line.

In the memory block structure as shown in FIG. 3, a read operation and a program operation (write operation) may be performed in units of pages, and an erase operation may be performed in units of memory blocks.

Figure 4:
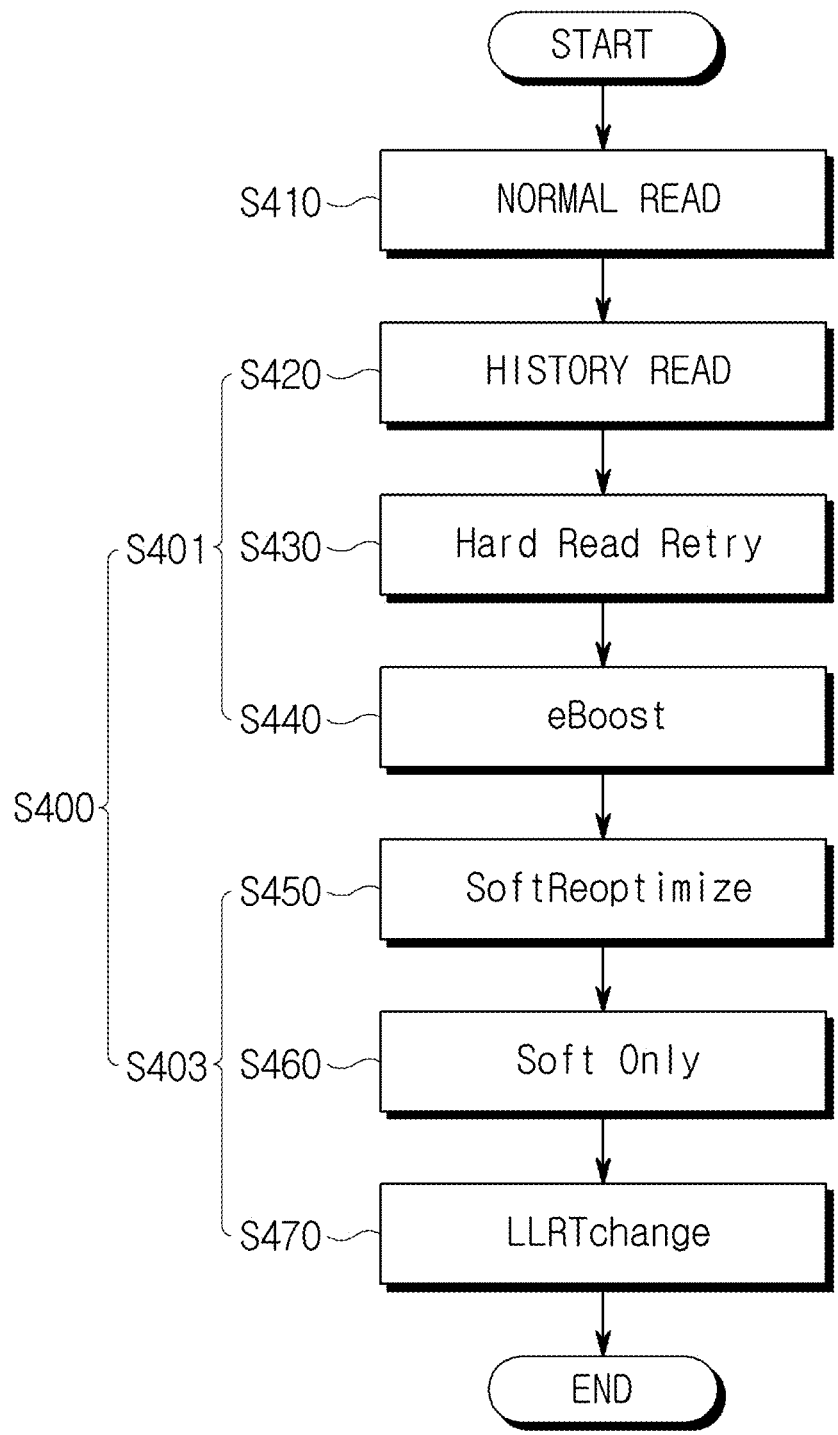
FIG. 4 is a diagram for describing a read recovery operation of a storage device.

FIG. 4 is a diagram for describing a read recovery operation of a storage device.

Referring to FIG. 4, when a normal read operation (S410) is performed and fails, a read recovery operation (S400) may be performed.

In the normal read operation (S410), the controller 120 may provide, in response to a read command from the external device 150, the memory 110 with a read command and a physical address indicating a cell location of the memory 110, in which data to be read are stored.

The memory 110 may provide read data obtained by reading data stored at the received physical address using a default read voltage to the controller 120. Here, the read voltage may be a voltage applied to identify data stored in a memory cell, and the default read voltage may be a read voltage determined through a test during a process of fabricating the memory 110.

Accordingly, in a read operation, the memory 110 may apply a read voltage to a word line WL corresponding to a physical address to be read, and compare a voltage charged in the memory cell with a threshold voltage to determine a value of an information bit stored in each cell.

Also, in the read operation, the controller 120 may perform an error correction and decoding operation on read data obtained from the memory 110. According to an embodiment, the error correction and decoding operation may be performed by the error detection and correction circuit 126 included in the controller 120.

The error correction and decoding operation may be an operation of recovering original data by correcting an error bit included in read data. The error correction and decoding operation may be successful or unsuccessful depending on whether the number of error bits included in read data is less than or equal to the number of correctable error bits. When the number of error bits included in the read data is less than or equal to the number of correctable error bits, the error correction and decoding may be successful. On the other hand, when the number of error bits included in the read data is greater than the number of correctable error bits, the error correction and decoding operation may fail. When the error correction and decoding operation is successful, original data corresponding to the logical address which is commanded to be read by the external device 150 may be recovered. Accordingly, when the error correction and decoding operation is successful, the read operation performed by the memory 110 may be successful. When the error correction and decoding operation fails, the controller 200 is unable to recover original data, and the normal read operation performed by the memory 110 may fail.

When it is determined that the normal read operation (S410) fails, the controller may perform a read recovery operation (S400) including a plurality of recovery operations for recovering the original data. The plurality of recovery operations may be performed according to a preset sequence. FIG. 4 illustrates an embodiment, and the recovery operation included in the read recovery operation (S400) is not limited thereto, and is not limited to the sequence shown in FIG. 4. As the recovery operation with high complexity is performed, the probability of obtaining the original data increases, but the number of operations or computations to be performed by the controller 200 increases, resulting in increased overhead and longer time to recover the original data. Accordingly, according to an embodiment, the controller 200 may perform recovery operations in the order from a recovery operation with a low complexity to a recovery operation with a high complexity. When original data is recovered by one of the recovery operations, the rest of the recovery operations may not be performed.

Referring to FIG. 4, a read recovery operation (S400) may be largely divided into a hard decoding operation (S401) and a soft decoding operation (S403). The hard decoding operation (S401), which has a low complexity and requires a short time to recover original data, may be performed prior to the soft decoding operation (S403).

The hard decoding operation (S401) may be to determine a value of each bit by performing decoding on each bit information of data received from the memory 110. According to one embodiment, the hard decoding operation (S401) may be to determine a read voltage, provide the read voltage to the memory 110, form read data using the value (0 or 1) of each bit determined by the memory 110 based on the read voltage, perform an error correction and decoding operation on the read data, and determine whether the hard decoding operation is successful or unsuccessful.

According to an embodiment, the hard decoding operation (S401) may include at least one of a history read operation (S420), a hard read retry operation (S430), and an eBoost operation (S440).

The history read operation (S420) may include determining whether there is information of a first read voltage used in a previous read operation for a physical address to be read in the memory 110, and when there is the information of the first read voltage, perform a read operation by providing the information of the first read voltage to the memory 110. The first read voltage may be different from the default read voltage provided during the normal read operation (S410). When there is no history related to the read voltage used in the previous read operation, the history read operation may not be performed.

The hard read retry operation (S430) may include storing in advance a plurality of read voltages according to scenarios in a read retry table (RRT), and select, when the previous read operation fails, at least one of the plurality of read voltages in the read retry table according to a current scenario, and provide information of the selected read voltage to the memory 110 to perform a read operation. According to an embodiment, the read retry table may include 50 read voltages RRT0 to RRT49. The controller 200 may select five read voltages (e.g., RRT2, RRT22, RRT0, RRT35, RRT42) among the 50 read voltages (RRT0 to RRT49) in the read retry table, and provide information of the selected five read voltages (e.g., RRT2, RRT22, RRT0, RRT35, and RRT42) to the memory 110 to perform a read operation. In the above embodiment, the number of read voltages included in the read retry table is not limited to 50 and may vary depending on embodiments. Similarly, the number of read voltages selected for a practical read operation may vary depending on embodiments without being limited to five.

Also, when the read operation is successful while the controller 200 is providing the information of the selected read voltages to the memory 110, the controller 200 may end the read recovery operation without providing an additional information of a read voltage.

The eBoost operation (S440) may be an operation in which the controller 200 calculates an optimal read voltage and provides the calculated optimal read voltage to the memory 110 to perform a read operation. Here, the optimal read voltage may be calculated by various methods. According to an embodiment, the optimal read voltage may be calculated using Gaussian modeling. Alternatively, the optimal read voltage may be calculated according to the number of '0's or '1's included in data read using a plurality of read voltages.

In the soft decoding operation (S403), the memory 110 may provide a digitized analog value, not provide a digital value of 0 or 1, for each bit. According to an embodiment, information of each bit may be represented by a plurality of bits, not simply by a single bit. The soft decoding operation (S403) may have a stronger error correction capability than the hard decoding operation (S401), but may consume a lot of resources and require high complexity in implementation. Also, the soft decoding operation (S403) may require more read delay time than the hard decoding operation (S401). According to an embodiment, when two bits are used to represent one-bit information, the memory 110 may need to change the read voltage and perform sensing three times to generate 4-level information that can be expressed by 2 bits. As the number of bits used to represent one-bit information increases, the number of times of sensing to be performed while changing the read voltage may increase.

According to an embodiment, the soft decoding operation S403 may perform sensing using an additional read voltage based on the above-described default read voltage or the optimal read voltage determined in the eBoost operation. In this case, the soft decoding operation S403 may be performed according to a soft re-optimize operation (S450), a soft-only operation (S460), and a log likelihood ratio (LLR) table change operation (S470) depending on how to generate an additional read voltage.

Referring to FIG. 4, when the hard decoding operation (S401) is successful, it is determined that the read recovery operation is successful, and subsequent operations may be terminated without being performed. In addition, when the soft decoding operation (S403) is successful, it is determined that the read recovery operation is successful, and subsequent operations may be terminated without being performed.

When the soft decoding operation (S403) fails, it is determined that the read recovery operation (S400) fails and the read recovery operation (S400) may be terminated. Thereafter, a memory cell corresponding to the physical address may be determined as a defective cell and further use may be prohibited.

As described above, the hard decoding operation is able to determine read success or read failure by performing sensing once based on a provided read voltage, resulting in a reduction in complexity and latency. On the other hand, sensing needs to be performed multiple times in the soft decoding operation, resulting in an increase in complexity and latency.

Since read operations for the memory 110 are sequentially performed, when a plurality of read commands are provided and a read recovery operation is performed on a read command currently being processed, the subsequent read commands may be delayed until the read recovery operation according to the read command currently being processed has been completed. That is, the subsequent read commands have undergone considerable delay due to read failure and read recovery in a current read operation, thus deteriorating read performance of the storage device 100.

The present disclosure recognizes the above-described problem. When there is a subsequent read command, the present disclosure performs the subsequent read command by suspending the soft decoding operation (S403) immediately after the hard decoding operation (S401) for the current read command fails, and then resumes the suspended soft decoding operation during an idle time when no more read commands are queued.

Figure 5A:
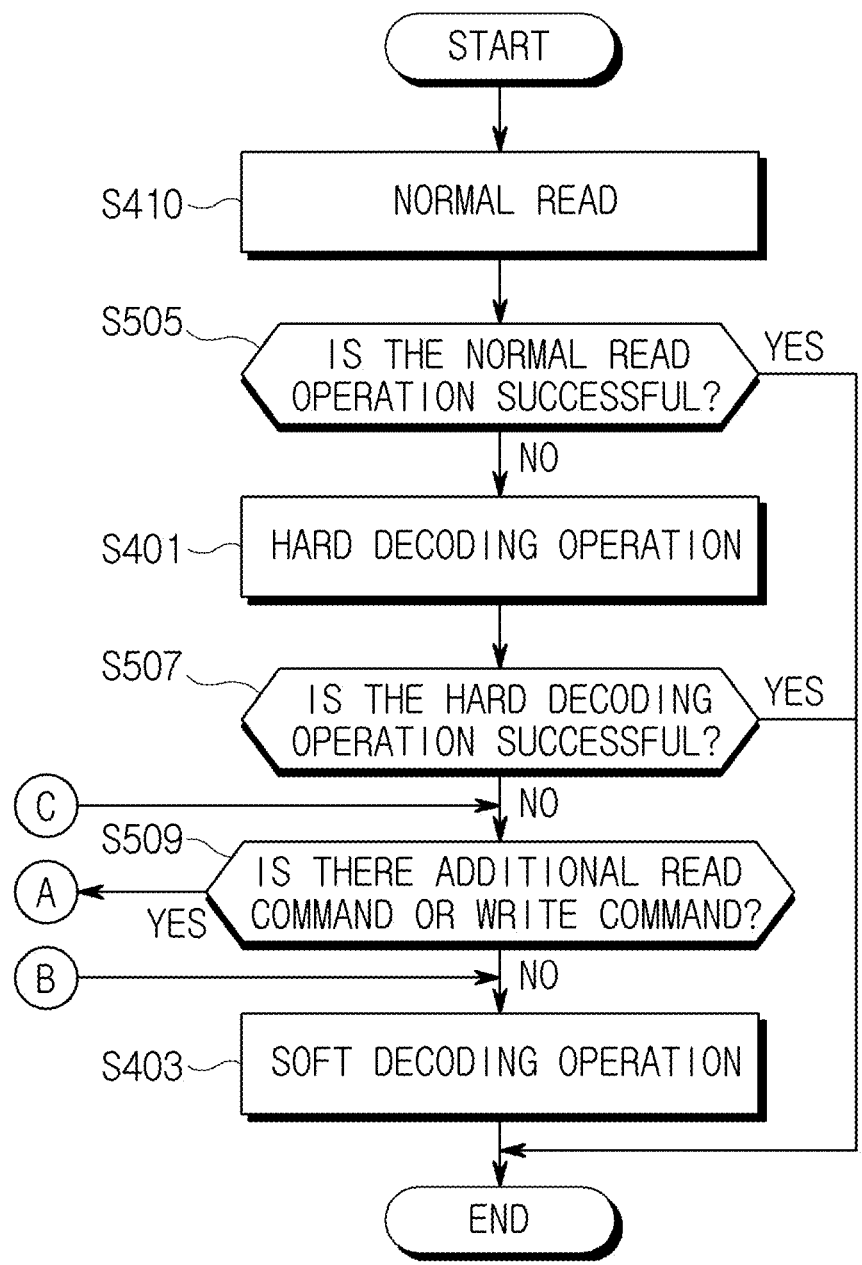
FIGS. 5A and 5B are diagrams for describing a read recovery operation according to embodiments of the present disclosure.
Figure 5B:
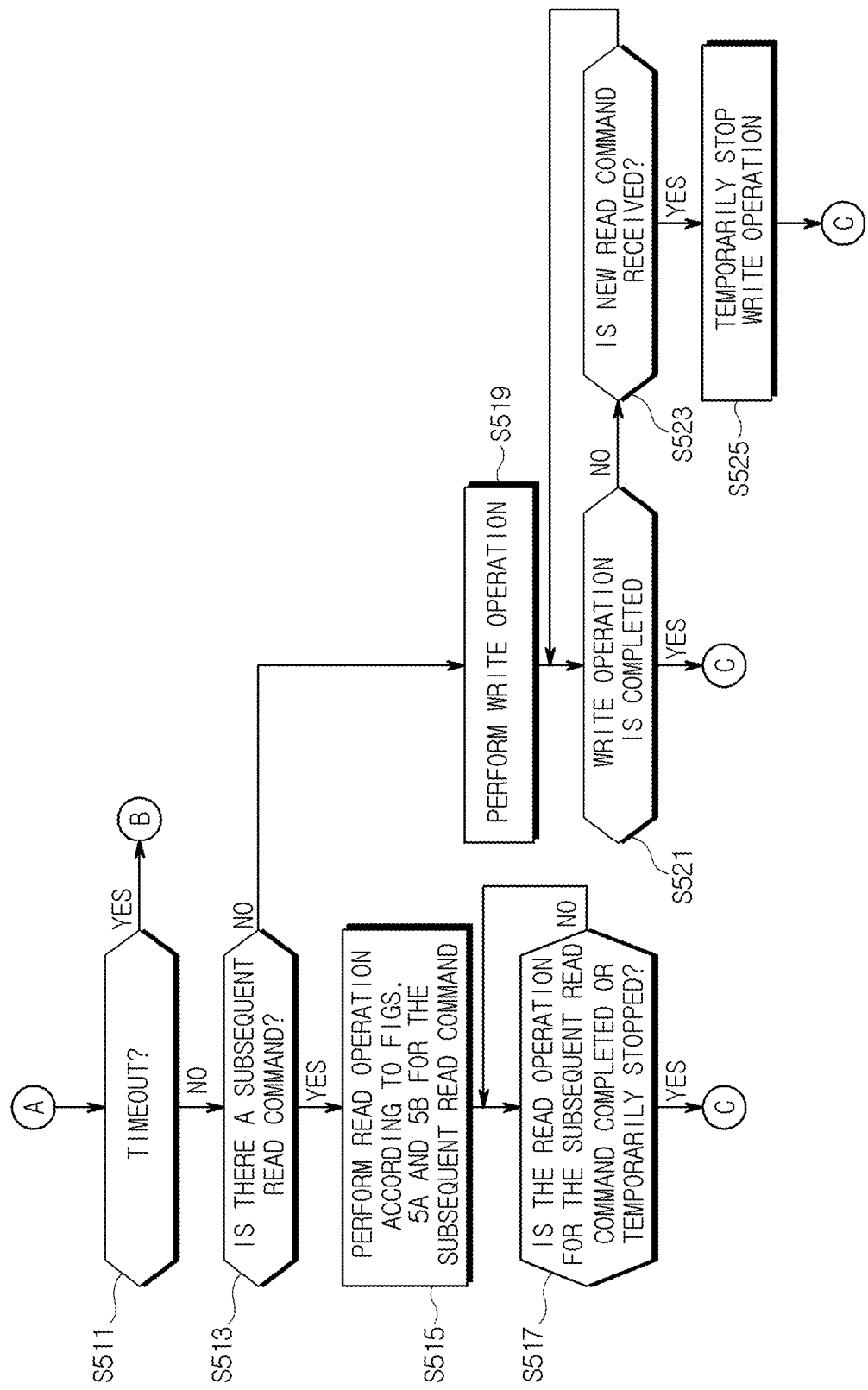

FIGS. 5A and 5B are diagrams for describing a read recovery operation according to embodiments of the present disclosure.

Referring to FIGS. 5A and 5B, whether or not a normal read operation is successful is determined (S505) after the normal read operation (S410), and when the normal read operation is successful, a read operation is immediately terminated. On the other hand, when the normal read operation fails, the controller 200 may perform the hard decoding operation (S401). According to an embodiment, the controller 200 may perform at least one of the history read operation (S420), the hard read retry operation (S430), and the eBoost operation (S440) illustrated in FIG. 4.

After the hard decoding operation (S401), whether or not the hard decoding operation is successful may be determined again (S507). According to an embodiment, when a plurality of hard decoding operations are performed, whether or not each hard decoding operation is successful may be determined after each hard decoding operation. As a result, when the hard decoding operation is successful, the read operation may be terminated. On the other hand, when the hard decoding operation is not successful in all hard decoding operations, unlike the prior art, the soft decoding operation (S403) may not be performed and may be suspended.

According to embodiments of the present disclosure, when the hard decoding operation (S401) is not successful, the controller 200 may determine whether there is an additional read command or write command (S509). According to one embodiment, when a read command or a write command is received from the external device 150, the controller 200 may store the command in a buffer according to priorities. In this case, a buffer for storing a read command and a buffer for storing a write command may be provided separately. When there is a read command or write command stored in a buffer, the controller 200 may determine that there is an additional read command or write command.

When there is no additional read command or write command, the controller 200 may immediately resume the suspended soft decoding operation (S403).

On the other hand, when there is an additional read or write command, a read or write operation may be performed according to the additional read or write command.

The controller 200 may determine whether a read operation of the suspended soft decoding operation (S403) has timed out (S511). According to an embodiment, the controller 200 may set a timeout time for a read command when receiving the read command from the external device 150. When the external device 150 does not receive data from the storage device 100 within a predetermined period of time after transmitting a read command, the external device 150 may abort the corresponding read command. Therefore, the controller 200 may need to complete the read operation according to the read command before the external device 150 aborts the read command (i.e., before the controller 200 receives a read abort command). According to an embodiment, the controller 200 may need to appropriately set a timeout time such that the external device 150 is able to complete the read command before aborting it because the controller 200 is unable to perform the read recovery operation continuously. Further, the controller 200 may resume the suspended soft decoding operation (S403) immediately when it is determined that the timeout has occurred in operation S511.

According to an embodiment, the setting of the timeout time as described above may be selectively performed. The reason for this is that a read operation for the corresponding read command can be completed as failure or success when the read operation is successful or a read abort command is received from the external device 150 although the timeout time is not set.

In operation S511, when it is determined that the timeout has not occurred, the controller 200 may determine whether there is a subsequent or additional read command to be processed (S513). When there is the subsequent or additional read command, the controller 200 may perform the read operation according to FIGS. 5A and 5B for the subsequent or additional read command (S515). According to an embodiment, when the read operation according to FIGS. 5A and 5B is performed for the subsequent or additional read command, it may be determined whether the read operation for the subsequent or additional read command has been completed or temporarily stopped (S517). When the read operation for the subsequent or additional read command has not been completed or temporarily stopped, the controller 200 may be performing a normal read operation (S410) or a hard decoding operation according to the subsequent or additional read command. When the controller 200 determines that the normal read operation or the hard decoding operation is successful for the subsequent or additional read command in operation S505 or operation S507, the controller 200 may determine that the read operation for the subsequent or additional read command has been completed, and proceeds to operation S509 to determine whether there is an additional read command or write command.

Although the controller 200 performs the read operation of FIGS. 5A and 5B in response to the subsequent or additional command in operation S515, the controller 200 may determine that the read operation for the subsequent or additional read command is temporarily stopped when the hard decoding operation S401 for the subsequent or additional read command fails. Then, information on the subsequent or additional read command may be temporarily stored in the read recovery buffer of the controller 200. Accordingly, the read recovery buffer may include information on a plurality of read commands on which suspended read recovery operations (i.e., the suspended soft decoding operations) are to be resumed. According to an embodiment, when a suspended read recovery operation for the subsequent or additional read command in the read recovery buffer can be resumed because there is no additional read command or write command, the controller 200 may determine a read command to be first performed among the read commands of the read recovery buffer according to priorities. For example, a read command first stored in a read recovery buffer may have a high priority in a first in first out (FIFO) manner. Alternatively, a read command to be timed out the earliest may have a higher priority. Meanwhile, among read commands temporarily stored in the read recovery buffer, a read command for which a timeout has occurred may directly perform the soft decoding operation (S403) regardless of priority. Here, the read recovery buffer may exist in the working memory 125.

When it is determined that there is no read command (that is, only a write command exists) in operation S513, the controller 200 may perform a write operation based on the next write command (S519).

The controller 200 may determine whether the write operation has been completed (S521). When it is determined that the write operation has been completed, the controller 200 may proceed to operation S509 to determine whether there is an additional read command or write command.

When it is determined that the write operation has not been completed, the controller 200 may determine whether a new read command is received (S523). Since a read command conventionally has a higher processing priority than a write command, when it is determined that a new read command is received, the controller 200 may temporarily stop the write operation (S525) and proceed to operation S509 to again determine whether there is an additional read command or write command. Then, when the timeout for the temporarily stopped read command of the suspended soft decoding operation has not occurred, the controller 200 may perform the new read command according to operations S509 and S513.

When the write operation has not been completed and a new read command is not received, the controller 200 may periodically and repeatedly perform determination whether the write operation has been completed (S521) and determination of whether the new read command is received (S523). According to another embodiment, the controller 200 may exit from a standby state and perform a subsequent operation when receiving an interrupt related to completion of the write operation or an interrupt related to reception of the new read command while being in the standby state.

The controller 200 may perform a read operation based on the subsequent or additional read command or a write operation based on an additional write command until a timeout of the temporarily stopped read command of the suspended soft decoding operation occurs. Therefore, the controller 200 may resume the suspended soft decoding operation (S403) after the subsequent or additional read commands and the additional write commands have been all processed or when a timeout occur. As a result of resuming the suspended soft decoding operation (S403), the read recovery operation of the resumed soft decoding operation may be successful or has finally failed.

Although it has been described that both a read command and a write command are processed in a situation where the read recovery operation is temporarily stopped, according to another embodiment, it is possible to process only a read command in a situation where the read recovery operation is temporarily stopped. That is, in operation S509, the controller 200 may determine whether there is an additional read command, and may not determine whether there is a write command. The reason for this is that, since a read command is likely to be timed out because a write operation requires quite a long time to be performed and the read command usually has a higher priority than the write command, the read command on which the read recovery operation is performed may be given a higher priority than the write command.

According to an embodiment, when a read abort command for completely stopping the read recovery operation is received while the read recovery operation is temporarily stopped, the controller 200 may set a flag indicating that the read recovery operation is aborted. A field for the flag may be in the read recovery buffer associated with the a read command of the suspended soft decoding operation. Further, when the storage device 100 is in an idle state in which any operation is not performed, the read recovery operation may be again performed for the aborted read command. In this case, the controller 200 may restart from the hard decoding operation (S401) or perform only the soft decoding operation (S403) as the read recovery operation. In this case, even when the restarted read recovery operation is successful, read data may not be transmitted to the external device 150. However, there is a very high possibility that the controller 200 receives the same read command as the aborted read command from the external device 150. In this case, the controller 200 may transmit the read data, on which the restarted read recovery operation is successful, to the external device 150 without an additional read operation.

According to FIGS. 5A and 5B, it is possible to reduce a delay time for a read command queued by processing the read command queued in advance without performing a soft decoding operation that requires a long time for the read command for which the hard decoding operation fails, and prevent a user from recognizing a read delay phenomenon due to the failure of reading.

According to an embodiment, the operations shown in FIGS. 5A and 5B may be efficiently used in a storage device employing a multi-queue while performing asynchronous reading. The read command of a read queue at the back cannot be processed if the read command of a read queue at the front is not processed for each queue. Therefore, when a recovery operation is performed due to the failure of the read command of the read queue at the front, operation S509 of FIGS. 5A and 5B has no choice but to process a read command of a queue other than the queue in which the read command fails. Therefore, the operations shown in FIGS. 5A and 5B may be efficient in a storage device performing an asynchronous read operation and employing a multi read queue and may not be efficient in a storage device performing a synchronous read operation and employing a single read queue.

However, even in the storage device performing the synchronous read operation employing the single read queue, the operations of FIGS. 5A and 5B may be applied in such a way that a read command for which reading has failed even by the hard decoding operation (S401) is deleted from the single read queue and temporarily stored in a read recovery buffer. Then, even in the storage device employing the single read queue, a delay time for a read command queued at the back may be reduced, and it is possible to prevent a user from recognizing a read delay phenomenon due to the failure of reading.

On the other hand, when the hard decoding operation (S401) fails and therefore the read recovery operation is temporarily stopped and other read commands are processed, the read command for which the hard decoding operation fails may be queued until other read commands have been processed. When a corresponding read command is queued in a queue, it may be necessary to turn off a watchdog (WDT) because the watchdog (WDT) is likely to occur as the corresponding read command is not processed for a certain period of time.

In the present disclosure, a second embodiment of a new read recovery operation is proposed in addition to the read recovery operation of the first embodiment shown in FIGS. 5A and 5B.

The difference between the plurality of recovery operations used in the hard decoding operation (S401) of the first embodiment is how to set the read voltage used to obtain the information stored in the memory cell. The history read operation (S420) is to use read voltage information previously applied to a word line (WL) to be read. The hard read retry operation (S430) is to set a plurality of read voltages according to various scenarios and select and use some of the plurality of read voltages set according to a situation in which reading has failed. This boost operation (S440) is to calculate and use an optimal read voltage by using Gaussian modeling or the like.

Unlike the hard decoding operation method of the first embodiment, the method of the second embodiment according to the present disclosure may be an adjacent word line-based read recovery operation, which uses a read voltage used in word lines (e.g., WL0 or WL2) adjacent to a word line (e.g., WL1) to be read currently. The second embodiment is based on the fact that memory cells connected to adjacent word lines have similar characteristics because they are adjacent to each other. In particular, in the case of a word line directly above or below a boundary word line, the read recovery operation may be performed more quickly than when the read recovery operation is performed according to a read voltage preset in a read retry table.

Another proposed method may be an adjacent page-based read operation using a read voltage used in the case of reading a page adjacent to a page for which reading has failed since the minimum read unit is a page. It is conceived that memory cells connected to adjacent pages have characteristics more similar to each other than adjacent word lines because they are adjacent to each other.

Figure 6:
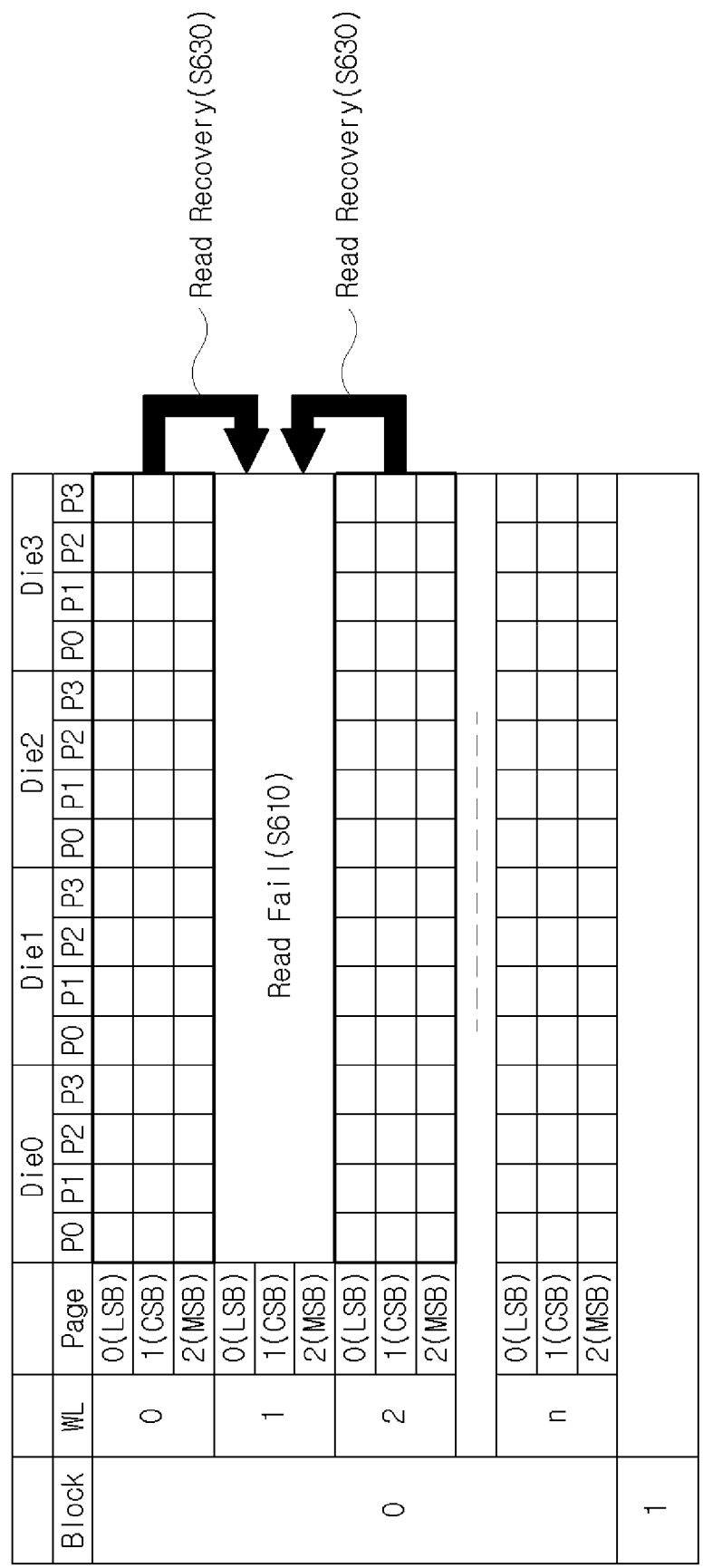
FIG. 6 is a diagram illustrating a read recovery operation using read voltages of adjacent word lines according to an embodiment of the present disclosure.

FIG. 6 is a diagram illustrating a read recovery operation using read voltages of adjacent word lines according to an embodiment of the present disclosure.

Referring to FIG. 6, when a normal read operation fails on a word line 1 (WL1) (S610), a method according to the present disclosure may include performing a read recovery operation (S620, S630) of the word line 1 (WL1) using a read voltage which has been used in the case of reading data of a word line 0 (WL0) or a word line 2 (WL2) adjacent to the word line 1 (WL1). As shown in FIG. 6, the read voltage is determined using the fact that adjacent word lines have similar characteristics because they are physically adjacent to each other.

FIG. 7 is a diagram illustrating a read recovery operation using read voltages for adjacent pages according to an embodiment of the present disclosure.

Referring to FIG. 7, a normal read operation fails on a page 3 (P3) of a word line 1 (WL1) in a Die 0 (Die0) (S710). Then, the method according to the present disclosure may include performing a read recovery operation using a read voltage used in the case of reading a page adjacent to the page 3 (P3) of the word line 1 (WL1) in the Die 0 (Die0). For example, the controller 200 may perform a read recovery operation using a read voltage used in the case of reading a page 3 (P3) of a word line 0 (WL0) in the Die 0 (Die0) (S720), perform a read recovery operation using a read voltage used in the case of reading a page 2 (P2) of the word line 1 (WL1) in the Die 0 (Die0) (S730), or perform a read recovery operation using a read voltage used in the case of reading a page 3 (P3) of a word line 2 (WL2) in the Die 0 (Die0) (S740).

As described above, it is possible to increase the possibility of read recovery by using a read voltage used in the case of reading a page physically adjacent to a page where the read failure has occurred.

In order to implement the read recovery operation according to the present disclosure, the working memory 125 or the memory 110 may need to include a memory area for temporarily storing a read voltage for each word line or each page.

According to the present disclosure, the performance of the system can be improved by reducing the latency for the read operation, which has not been performed for the read recovery operation and has been queued using conventional technology. In addition, the read recovery method according to the present disclosure enables quick read recovery by selecting an optimal read voltage, thereby reducing the cost of a storage device.

According to various embodiments of the present disclosure, it is possible to reduce the cost of a storage device by maximally efficiently recovering from a read failure.

According to various embodiments of the present disclosure, it is possible to further improve system performance by reducing a latency for a read operation queued after a failed read operation.

According to various embodiments of the present disclosure, it is possible to prevent an end user using the storage device from recognizing that the reading has failed and taking another operation, thus enabling normal operation.

While embodiments of the present invention have been described with reference to the attached drawings, it would be understood by those of ordinary skill in the art that the technical configuration of the present invention may be implemented in other detailed forms without changing the technical spirit or the essential features of the present invention. Thus, it should be noted that the above-described embodiments are provided as examples and should not be interpreted as limiting. Moreover, the scope of the present invention should be defined by the following claims rather than the detailed description provided above. Furthermore, the meanings and scope of the claims and all changes or modified forms derived from their equivalents should be construed as falling within the scope of the present invention, and the disclosed embodiments may be combined to form additional embodiments.

What is claimed is:

1. An operation method of a memory controller, the operation method comprising:
    a first read operation of obtaining first read data from a second external device based on a first read command received from a first external device and performing error correction and decoding on the first read data to determine whether the first read operation is successful or unsuccessful;
    a first read recovery operation of performing a hard decoding-based read recovery operation and a soft decoding-based read recovery operation when the first read operation is determined to be unsuccessful;
    an operation of determining whether there is a second read command queued when the hard decoding-based read recovery operation has failed;
    an operation of temporarily stopping the first read recovery operation when there is the second read command queued; and
    a second read operation of obtaining second read data from the second external device based on the second read command and performing the error correction and decoding on the second read data.

2. The operation method of claim 1, further comprising performing the soft decoding-based read recovery operation by resuming the first read recovery operation after the second read operation is successful.

3. The operation method of claim 2, further comprising an operation of resuming, in a case where an abort command for the first read command is received while the first read recovery operation is temporarily stopped, the first read recovery operation when the memory controller is in an idle state.

4. The operation method of claim 1, further comprising:
    performing, after the second read operation is successful and when there are read commands queued, a third read operation according to each of third read commands queued until the third read commands queued have been processed; and
    performing the soft decoding-based read recovery operation by resuming the first read recovery operation after the read operation according to each of the read commands queued have been processed.

5. The operation method of claim 1, wherein the hard decoding-based read recovery operation comprises at least one of a history read operation, a hard read retry operation, and an eBoost operation.

6. The operation method of claim 1, wherein the hard decoding-based read recovery operation comprises an adjacent word line-based read operation of:
    providing, to the second external device, as information of a read voltage for the first read operation, information of a second read voltage which has applied to a second word line adjacent to a first word line of a page to be read in the first read operation; and
    obtaining the first read data from the second external device.

7. The operation method of claim 1, wherein the hard decoding-based read recovery operation comprises an adjacent page-based read operation of:
    providing, to the second external device, as information of a read voltage for the first read operation, information of a third read voltage which has been used in reading a page adjacent to a page to be read in the first read operation; and
    obtaining the first read data from the second external device.

8. A memory controller comprising:
    a controller configured to:
    perform a first read operation of obtaining first read data from a second external device based on a first read command received from a first external device, and performing error correction and decoding on the first read data to determine whether the first read operation is successful or unsuccessful;
    perform a hard decoding-based read recovery operation for recovering the first read data when the first read operation is determined to be unsuccessful;
    determine whether there is a second read command queued when the hard decoding-based read recovery operation fails; and
    perform a second read operation of obtaining, when there is the second read command queued, second read data from the second external device based on the second read command and performing the error correction and decoding on the second read data without performing a soft decoding-based read recovery operation for recovering the first read data.

9. The memory controller of claim 8, wherein the controller is further configured to perform the soft decoding-based read recovery operation after the second read operation is successful.

10. The memory controller of claim 8, wherein the controller is further configured to:
    perform, after the second read operation is successful and when there are read commands queued, a third read operation according to each of the read commands queued until the read commands queued have been processed; and
    perform the soft decoding-based read recovery operation after the third read operation according to each of the read commands queued have been processed.

11. The memory controller of claim 8, wherein the controller is configured to perform, as the hard decoding-based read recovery operation, at least one of:
    an adjacent word line-based read operation of providing, to the second external device, as information of a read voltage for the first read operation, information of a second read voltage which has applied to a second word line adjacent to a first word line of a page to be read and obtaining the first read data from the second external device; and
    an adjacent page-based read operation of providing, to the second external device, as information of a read voltage for the first read operation, information of a third read voltage which has been used in reading a page adjacent to a page to be read and obtaining the first read data from the second external device.

12. A storage device comprising:

a memory configured to receive information of a read voltage, determine values of data recorded in memory cells based on the read voltage and provide the data; and a memory controller configured to:

perform a first read operation of obtaining first read data from the memory based on a first read command received from an external device, and performing error correction and decoding on the first read data to determine whether the first read operation is successful or unsuccessful;

perform a hard decoding-based read recovery operation for recovering the first read data when the first read operation is determined to be unsuccessful;

determine whether there is a second read command queued when the hard decoding-based read recovery fails;

perform a second read operation of obtaining, when there is the second read command queued, second read data from the memory based on the second read command and performing the error correction and decoding on the second read data without performing a soft decoding-based read recovery operation for recovering the first read data.

13. The storage device of claim 12, wherein the memory controller is further configured to perform the soft decoding-based read recovery operation after the second read operation is successful.

14. The storage device of claim 12, wherein the memory controller is configured to:

perform, after the second read operation is successful and when there are read commands queued, a third read operation according to each of the read commands queued until the read commands queued have been processed; and perform the soft decoding-based read recovery operation after the third read operation according to each of the read commands queued have been processed.

15. The storage device of claim 12, wherein the memory controller is configured to perform, as the hard decoding-based read recovery operation, at least one of:

an adjacent word line-based read operation of providing, to the memory, as information of a read voltage for the first read operation, information of a second read voltage which has applied to a second word line adjacent to a first word line of a page to be read and obtaining the first read data from the memory; and an adjacent page-based read operation of providing, to the memory, as information of a read voltage for the first read operation, information of a third read voltage which has been used in reading a page adjacent to a page to be read and obtaining the first read data from the memory.

* * * * *